US008880925B2

(12) United States Patent
Chang et al.

(10) Patent No.: US 8,880,925 B2
(45) Date of Patent: Nov. 4, 2014

(54) TECHNIQUES FOR UTILIZING ENERGY USAGE INFORMATION

(75) Inventors: Mark M. Chang, Saratoga, CA (US); Scott E. Shull, Hillsboro, OR (US); Milan Milenkovic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 13/174,338

(22) Filed: Jun. 30, 2011

(65) Prior Publication Data

US 2011/0314320 A1    Dec. 22, 2011

(51) Int. Cl.

| | |
|---|---|
| G06F 1/00 | (2006.01) |
| H02J 13/00 | (2006.01) |
| F24D 19/10 | (2006.01) |
| H04L 12/28 | (2006.01) |
| F24F 11/00 | (2006.01) |
| H02J 3/00 | (2006.01) |

(52) U.S. Cl.
CPC .............. *H02J 13/0017* (2013.01); *Y04S 40/12* (2013.01); *Y02B 30/762* (2013.01); *H04L 12/2803* (2013.01); *Y04S 20/244* (2013.01); *Y04S 20/221* (2013.01); *Y02B 70/3275* (2013.01); *Y02B 70/325* (2013.01); *Y04S 20/228* (2013.01); *F24F 11/0009* (2013.01); *F24F 2011/0075* (2013.01); *Y02B 90/2607* (2013.01); *F24D 19/1048* (2013.01); *Y02B 70/3216* (2013.01); *H02J 2003/003* (2013.01)
USPC ........................................................ 713/340

(58) Field of Classification Search
USPC ......................................... 713/300, 320, 340
See application file for complete search history.

(56) References Cited

U.S. PATENT DOCUMENTS

| | | | | |
|---|---|---|---|---|
| 8,037,329 | B2 * | 10/2011 | Leech et al. | 713/320 |
| 8,140,869 | B2 * | 3/2012 | Song et al. | 713/300 |
| 2008/0184230 | A1 | 7/2008 | Leech et al. | |
| 2008/0209247 | A1 * | 8/2008 | Thelander et al. | 713/323 |
| 2009/0195349 | A1 | 8/2009 | Frader-Thompson et al. | |
| 2010/0076615 | A1 * | 3/2010 | Daniel et al. | 700/293 |
| 2010/0077241 | A1 | 3/2010 | Piazza et al. | |
| 2010/0198752 | A1 | 8/2010 | Digon et al. | |
| 2011/0153101 | A1 * | 6/2011 | Thomas et al. | 700/291 |
| 2011/0296213 | A1 * | 12/2011 | Ferlitsch et al. | 713/320 |
| 2012/0078727 | A1 * | 3/2012 | Lee | 705/14.66 |
| 2012/0166115 | A1 * | 6/2012 | Apostolakis | 702/62 |

FOREIGN PATENT DOCUMENTS

| | | |
|---|---|---|
| KR | 100997647 | 12/2010 |
| WO | WO-2011029137 | 3/2011 |

OTHER PUBLICATIONS

International Preliminary Report on Patentability & Written Opinion for International Application No. PCT/US2012/032689 mailed Jan. 16, 2014, 7 pages.
International Search Report & Written Opinion for International Application No. PCT/US2012/032689 mailed Jul. 26, 2013, 10 pages.

* cited by examiner

*Primary Examiner* — Mark Connolly
(74) *Attorney, Agent, or Firm* — Blakely, Sokoloff, Taylor & Zafman LLP

(57) ABSTRACT

Techniques for energy consumption monitoring and analysis. Energy consumption of one or more energy consuming devices corresponding to a user is monitored. User profile information and user statistical information is utilized to analyze the monitored energy consumption to generate a personal energy usage profile for the user. The personal energy usage profile is transmitted to a computing platform associated with the user.

16 Claims, 5 Drawing Sheets

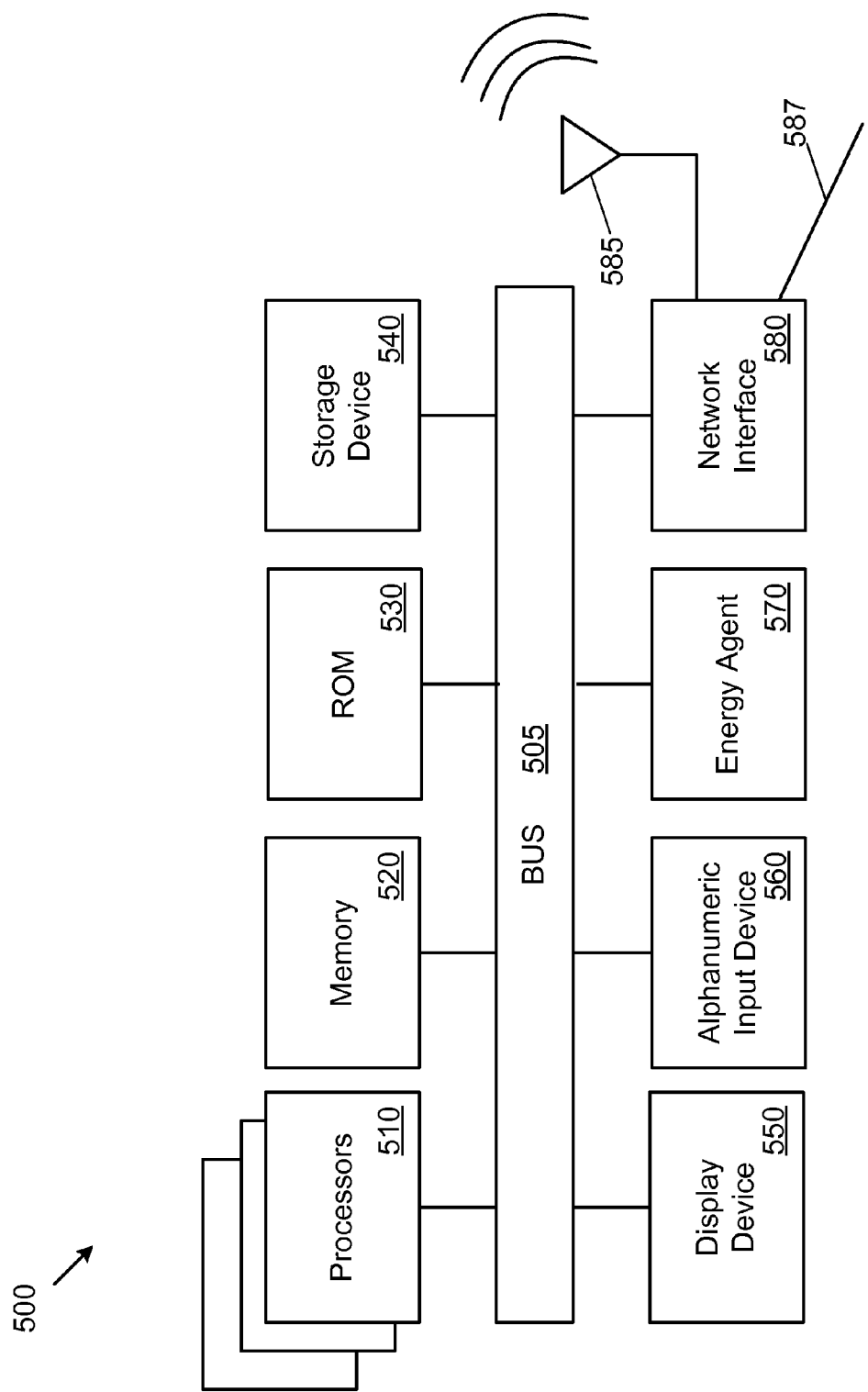

TECHNIQUES FOR UTILIZING ENERGY USAGE INFORMATION

TECHNICAL FIELD

Embodiments of the invention relate to techniques for determining energy usage. More particularly, embodiments of the invention relate to techniques for utilization of energy usage information to support improved energy consumption.

BACKGROUND

Tracking energy usage is increasingly important in many settings. For example, many regulations require that commercial buildings conform to certain energy efficiency requirements. In order to monitor compliance, energy usage must me measured in some way. Typical measurement techniques are based on dedicated hardware monitors, which can be expensive and complex.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 5 is a block diagram of one embodiment of an electronic system.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Currently, in the commercial office environment, there are no numeric representations of the amount of energy an individual is consuming across a range of concurrent activities: computing, lighting, heating/cooling, power strips, remote charging, etc. There is no analytical methodology to analyze the individual user's energy usage behavior in relation to his/her building, floor, department, etc. Also, there is no feedback mechanism available for building occupants to express their comfort level regarding, for example, temperature, lighting, air quality, etc. Similar limitations apply to other environments as well.

Figure 1:
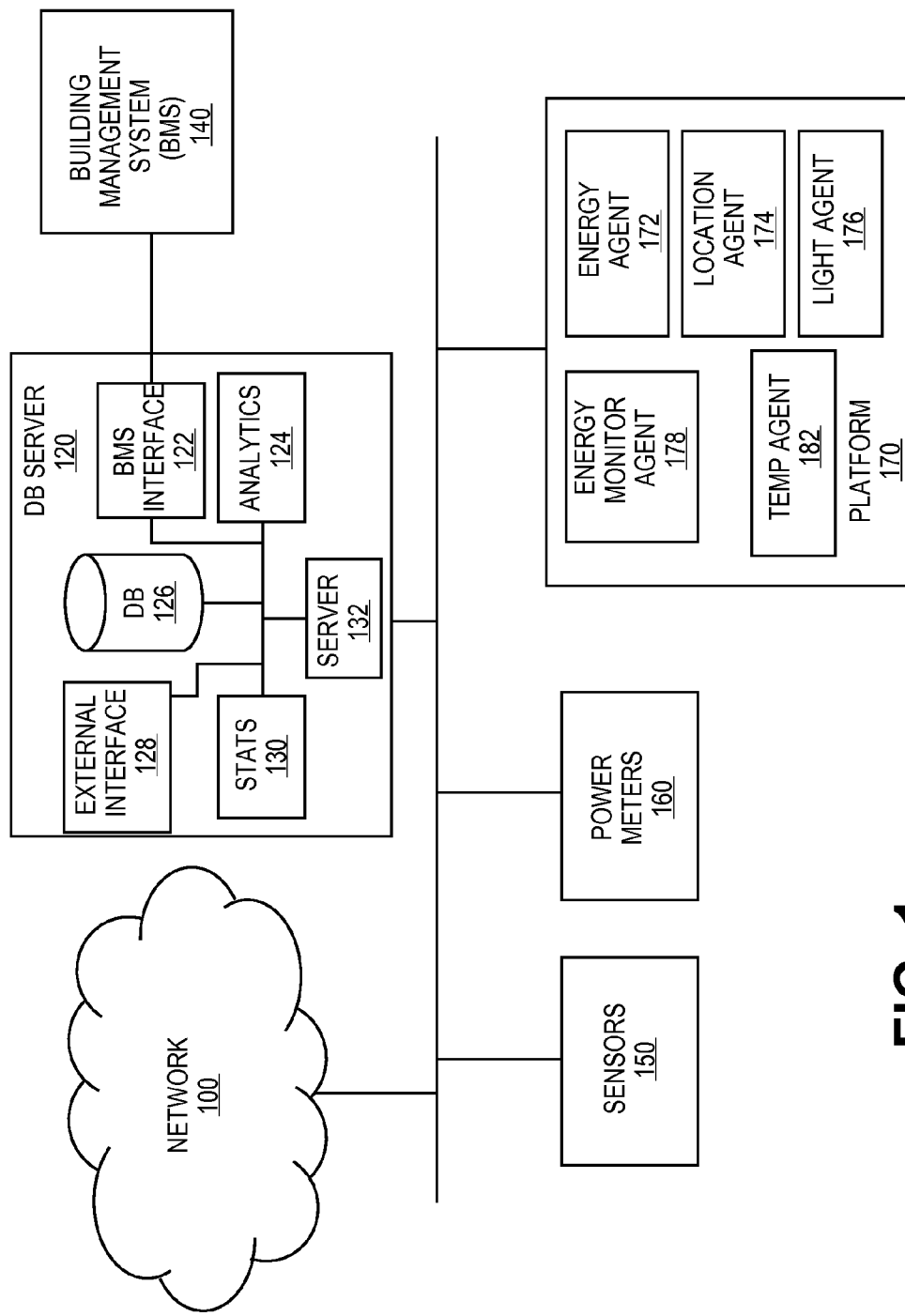
FIG. 1 is a block diagram of one embodiment of an architecture for monitoring energy consumption.

FIG. 1 is a block diagram of one embodiment of an architecture for monitoring energy consumption. The architecture of FIG. 1 allows for a two-way communication between an individual user of a platform and a building infrastructure including a building management system. This may provide for better feedback to a user as well as a better aggregate view of energy consumption.

Network 100 provides an interconnection between multiple electronic devices. Network 100 may provide communication with any number of remote devices not illustrated in FIG. 1. Network 100 may be, for example, the Internet.

Database (DB) server 120 may be coupled with network 100 and other systems. DB server 120 may also be coupled with building management system (BMS) 140 that may include information from, or access to (e.g., request certain actions or information), building systems (e.g., HVAC, electrical, hydraulic, automation) that may provide energy consumption data. DB server 120 may be coupled with BMS 140 via BMS interface 122, which may be one or more wired and/or wireless interfaces.

DB server 120 includes database (DB) 126, which is used to store information retrieved by, sent to, or otherwise acquired by DB server 120. In one embodiment, DB 126 stores energy consumption information gathered from the components illustrated in FIG. 1 as well as any other components. External interface(s) 128 provides one or more wired and/or wireless interfaces between DB server 120 and other sensors or components (not illustrated in FIG. 1).

Statistics 130 may be statistics that are derived by DB server 120 or are provided to DB server 120. Statistics 130 may be used to provide energy consumption information and/or to analyze and derive energy consumption information. Analytics 124 represent logic (e.g., hardware, software, firmware, any combination thereof) that provides analysis of the information stored by DB server 120. For example, analytics 124 may provide macro or micro analysis of energy consumption information as described herein. Server 132 provides services from DB server 120 to devices coupled with DB server 120.

Sensors 150 may be any sensors that provide information to any of the devices of FIG. 1. Sensors 150 may be any type of sensors, for example, temperature sensors, light sensors, wind sensors, etc. Sensors 150 may also include soft sensors, for example, a software agent that provides data in sensor format derived from other forms of data, such as a weather station report. Power meters 160 may be any power meters that provide power information to any of the devices of FIG. 1. Power meters 160 may be any type of power meters that monitor power, for example, at power outlets, light fixtures, or power consumption of any other electrical device.

Platform 170 represents any number of similar platforms that may be coupled with one or more networks interconnected with DB server 120 and/or other devices of FIG. 1. Platform 170 may be, for example, a laptop computer, a desktop computer, or any other device that may be utilized to provide some or all of the information described herein.

In one embodiment, platform 170 includes one or more of the agents illustrated in FIG. 1 in addition to logical and computational components not illustrated in FIG. 1. Energy monitoring agent may 178 provide energy monitoring feedback and functionality to a user of platform 170. Temperature agent 182 may monitor temperature conditions in and/or around platform 170. For example, temperature agent 182 may monitor the ambient temperature of the space in which platform 170 resides, or may monitor the temperature of platform 170.

Energy agent 172 monitors and/or computes, or otherwise determines energy consumption of platform 170. Energy agent 172 may operate as described herein to determine energy consumption. Location agent 174 operates to determine the position of platform 170. Location agent 174 may use global positioning system (GPS) technology, or other techniques for determining the location of platform 170.

Light agent 176 monitors light levels around platform 170. Light agent 176 may include, for example, an ambient light sensor. Light agent 176 may also calculate or otherwise determine light conditions in and around platform 170.

Conceptually, the techniques described herein operate by tracking the time that the monitored system (e.g., platform 170) spends in various operational states—such as running, idle, off—and by multiplying the time spent in each state with platform power drawn in each state to compute energy usage (energy=power×time). In one embodiment, there is provided (1) the ability to detect operational states of the monitored system and times spent in those operational states, and (2) information related to power consumption in each of the relevant operational states of the monitored system.

This principle may be applied to any electronic equipment or device (e.g., HVAC system) that has operational states with specific energy consumption, such as desktop computers or laptops, by providing a software agent to track platform power state occupancy using, for example, system calls, then compute energy usage by integrating over time state occupancy with power consumed in each state, thus yielding energy consumption in KWh. Non-electrical energy consumption can also be monitored, for example, a state of a heating system may be monitored and energy consumption may be determined by using the state of the heating system along with the amount of natural gas consumed in each state to determine an energy usage. This technique is applicable to other situations as well.

State-specific power usage of individual platforms required by this calculation may be measured by commercial instruments (one time bench/lab measurement per supported platform) or provided as specifications by vendors through machine-readable methods, such as an online web service. Note that vendors already measure and report these kinds of values to standards and rating bodies, such as ECMA and EnergyStar.

The energy-tracking agent(s) may reside on the platform or elsewhere in the infrastructure (e,g, a cloud service or with one device acting as proxy for another—PC for a printer). Currently energy measurement is performed via expensive external hardware power meters.

Described herein is an Eco Sensing Building (ESB) data model and analytical framework to provide data modeling and analytical implementations to accurately depict a holistic view of the energy consumption at the individual level, allow a user to express his/her comfort in the environment, and analyze the collected data to predict future energy usage trending and to advise the user regarding possible actions to reduce energy consumption. One or more of the following three components may be utilized.

Figure 2:
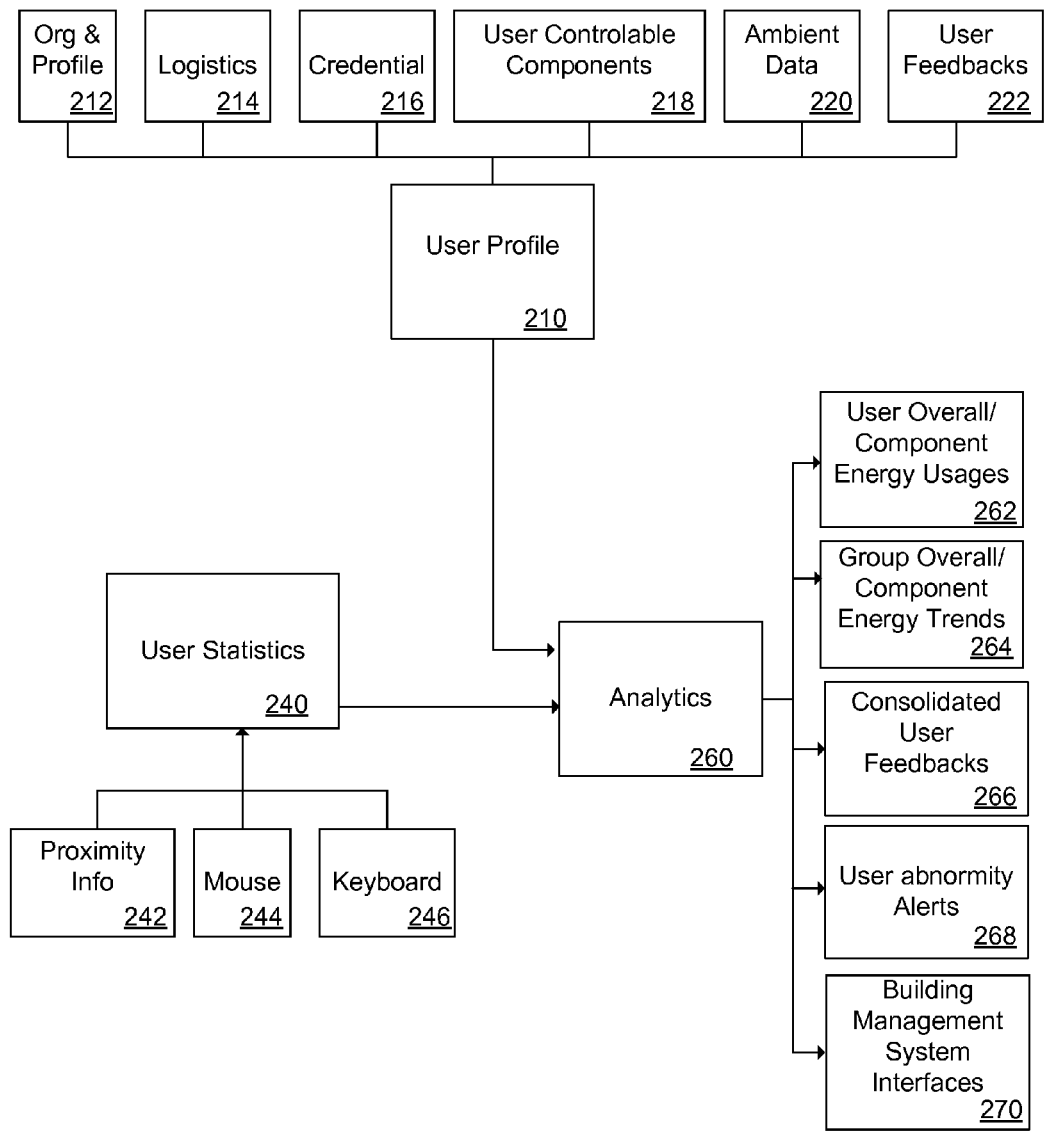
FIG. 2 is a conceptual block diagram of one embodiment of an Eco Sensing Building (ESB) architecture.

FIG. 2 is a conceptual block diagram of one embodiment of an Eco Sensing Building (ESB) architecture. The various components of the ESB architecture combine to provide an improved individual feedback and monitoring regarding energy consumption.

In one embodiment an ESB data model defines a user profile, 210, which may initially include, for example, a user's organization 212 and logistical information 214, such as what department he/she belongs to and what type of job functions (e.g., engineer, sales, administration), where the office is located and floor or area. Additional and/or different information may also be included in the profile.

The data model may also define user controllable energy consumption components 218 and ambient environment information 220, including, for example, laptop or desktop computers, monitors, power strips, task lights, office lights, personal heater/fan, personal or shared printers, personal energy quota, ambient light, temperature, humidity, user location, etc. The data model may also allow users to provide feedback 222 regarding ambient conditions such as being too hot or too cold, air quality, lighting, etc. By aggregating individual information, the data model extends the scope to various departmental, building, floor, working area levels, such as group energy quota, printer energy quotas, etc.

In one embodiment, ESB analytic tool 260 utilizes data collected via the ESB data model to analyze energy usage and trending. For example, desktop computer energy usage for the last 7 or 30 days, or to see if there is any abnormal behavior or excessive energy usage. In one embodiment, an alert may be generated 268 in response to excessive usage that may indicate a possible virus or malware problem, or malfunction, etc.

In one embodiment, ESB analytic tool 260 may also be used to analyze a user's total energy trending 262, which can be compared to, for example, energy usage of another comparable user to determine whether the user is within an average range. In one embodiment, the trending analysis 264 can take the ambient environmental information as possible influence factors, for example, weather season, office location, etc. Also, based on users' feedback 266 on ambient environmental conditions, the ESB analytic tool can suggest to the building management system to take some corrective actions. This information can also be aggregated to group levels so the building managers can receive notifications and take corrective actions 268.

ESB analytic tool 260 may collect user data 240, for example, the user's keyboard 246 and mouse 244 movement frequency and/or proximity information 242. By analyzing user information, the ESB analytic tool can function to advise the user with different power savings options, for example, using power control features on a computer during off hours, or advise facility managers to dim lights or adjust HVAC settings. In one embodiment, analytic tool 260 may interact with a building management system via building management system interface(s) 270 to provide feedback to (and possibly control) all or part of a building management system.

Figure 3:
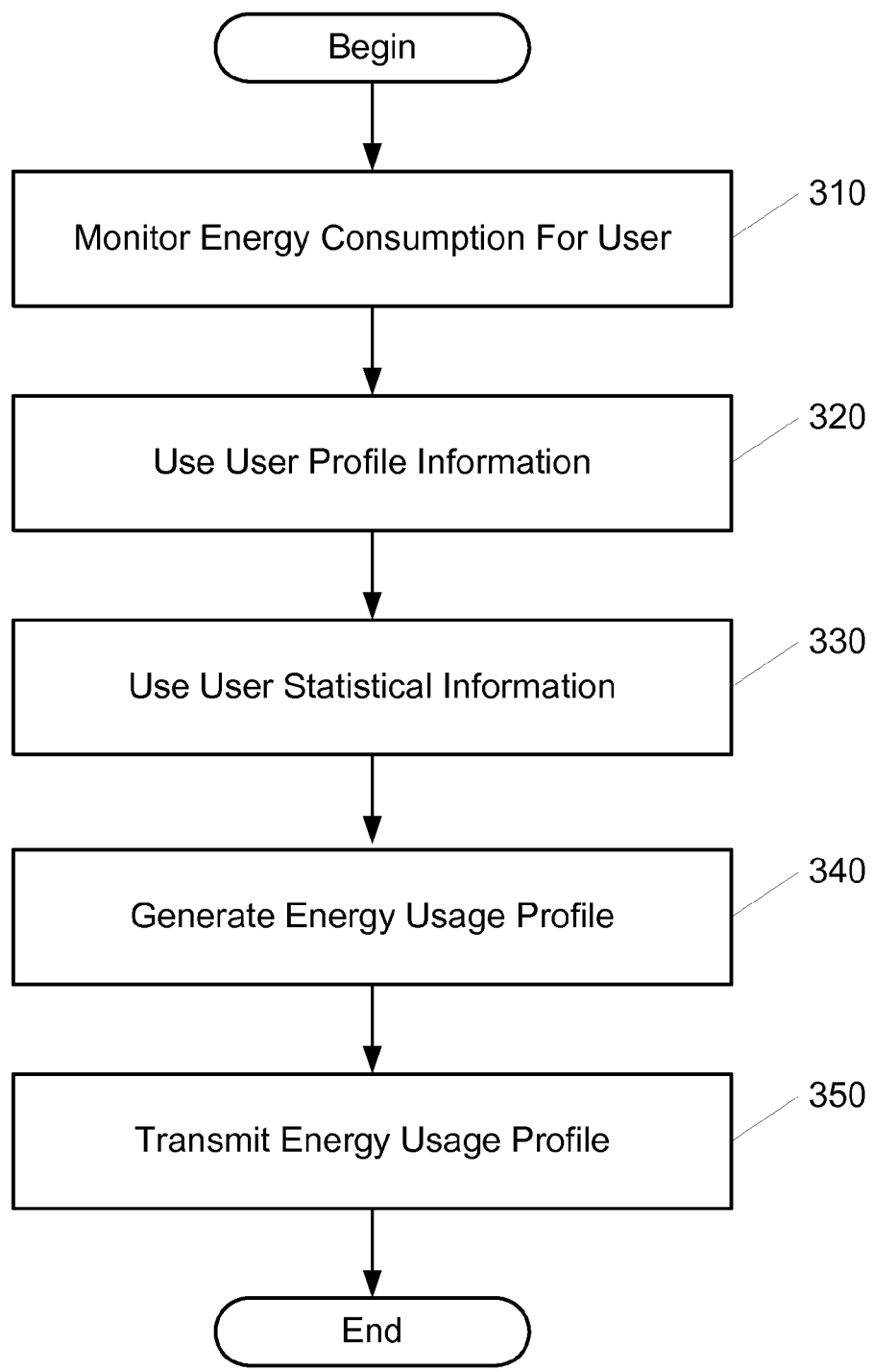
FIG. 3 is a flow diagram of one embodiment of a technique to create an energy usage profile.

FIG. 3 is a flow diagram of one embodiment of a technique to create an energy usage profile. The process of FIG. 3 may be utilized to analyze user energy consumption and to provide feedback to the user regarding his/her personal energy consumption.

Energy consumption for the user is monitored, 310. This may be accomplished using any monitoring techniques, including, but not limited to hardware power monitors, software monitoring and extrapolation/interpretation, testing, etc. The individual energy consumption may be for one or more devices including, for example, a computer, lighting, heating/cooling, power outlets, etc. For example, all power consumed within an office may be allocated to an occupant of that office.

The user profile information is used to analyze the energy consumption information, 320. The user profile information may be used, for example, to evaluate the user's energy consumption. User credentials may be used to determine how much energy may be consumed by the user or the ambient data may be used to adjust the user's energy budget.

The user statistical information is used to analyze the energy consumption information, 330. The statistical information may be used, for example, to determine when the user is in an office using the platform, or to determine when the user is in the office. Other user statistical information may also be used.

An energy usage profile is generated, 340. The energy usage profile may be used to give the user feedback regarding energy consumption. The energy usage profile may indicate a total energy usage as well as energy usage for individual component. The energy usage profile may also provide comparisons to, for example, other user, groups of users, targets, budgets, etc. The energy usage profile may be transmitted, 350, for example to the platform being monitored and/or to other devices.

Figure 4:
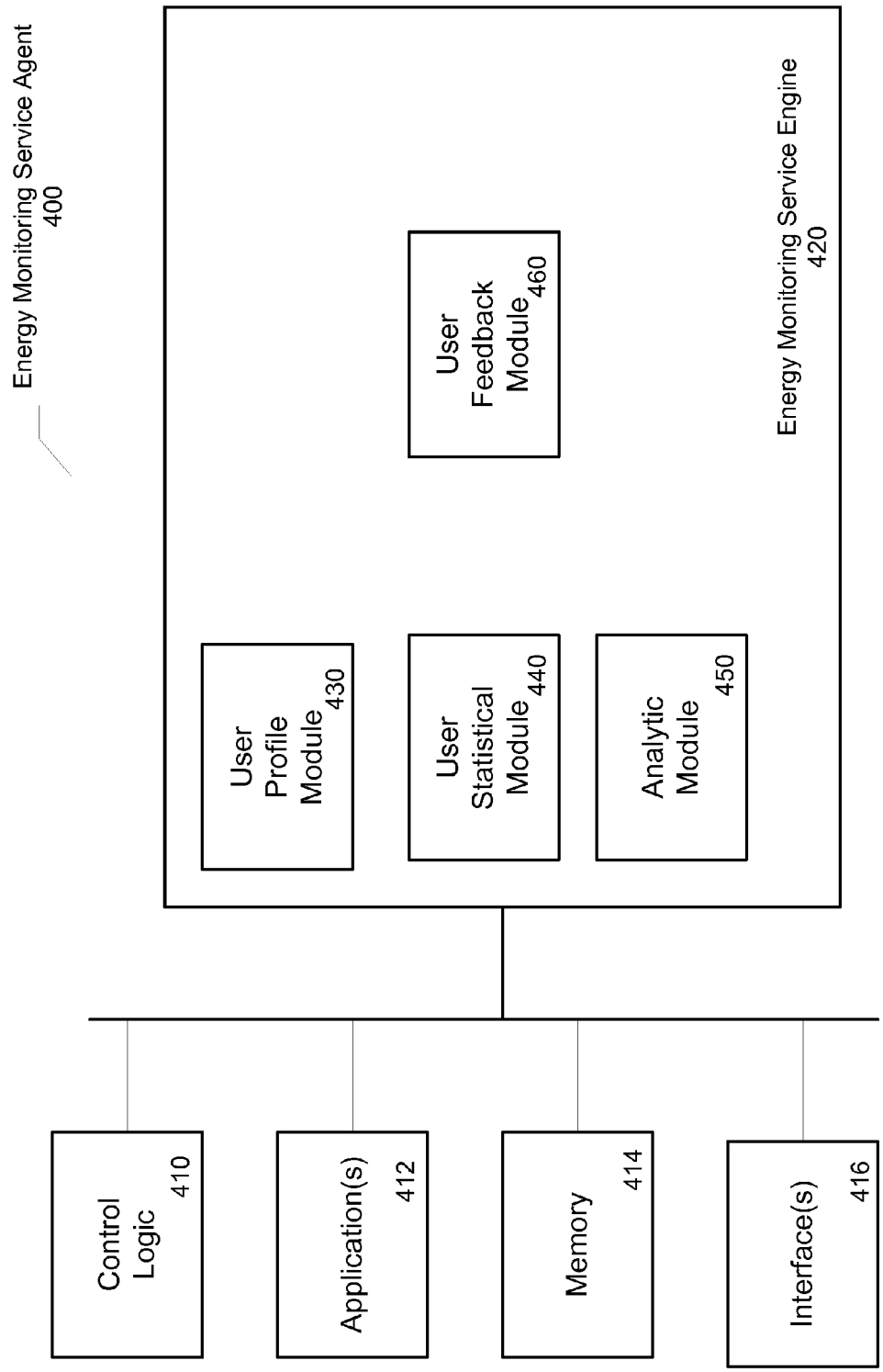
FIG. 4 is a block diagram of one embodiment of an energy monitoring service agent.

FIG. 4 is a block diagram of one embodiment of an energy monitoring service agent. The energy monitoring service agent of FIG. 4 may be part of server 132 in FIG. 1, for example, to provide services from DB server 120 to devices coupled with DB server 120.

Energy monitoring service agent 400 includes control logic 410, which implements logical functional control to direct operation of energy monitoring service agent 400, and/or hardware associated with directing operation of energy monitoring service agent 400. Logic may be hardware logic circuits and/or software routines. In one embodiment, energy monitoring service agent 400 includes one or more applications 412, which represent code sequence and/or programs that provide instructions to control logic 410.

Energy monitoring service agent 400 includes memory 414, which represents a memory device and/or access to a memory resource for storing data and/or instructions. Memory 414 may include memory local to energy monitoring service agent 400, as well as, or alternatively, including memory of the host system on which energy monitoring service agent 400 resides. Energy monitoring service agent 400 also includes one or more interfaces 416, which represent access interfaces to/from (e.g., an input/output interface, application programming interface) energy monitoring service agent 400 with regard to entities (electronic or human) external to energy monitoring service agent 400.

Energy monitoring service agent 400 also includes energy monitoring service engine 420, which represents one or more functions that enable energy monitoring service agent 400. Example modules that may be included in energy monitoring service engine 420 include user profile module 430, user statistical module 440, analytic module 450 and user feedback module 460. As used herein, a module refers to routine, a subsystem, etc., whether implemented in hardware, software, firmware or some combination thereof.

User profile module 430 operates to gather and maintain user profile information as described above. User profile module 430 may request information from the user and/or may monitor the user's activities to gather profile information. User profile module 430 may use the profile information to operate on energy consumption data and/or may provide the profile information to other modules and/or agents for processing of energy consumption data.

Statistical module 440 operates to gather and maintain statistical information as described above. Statistical module 440 may monitor the user's activities to gather statistical information and/or may monitor user activities, power consumption of various devices, retrieve historical data, etc. Statistical module 440 may use the statistical information to operate on energy consumption data and/or may provide the statistical information to other modules and/or agents for processing of energy consumption data.

Analytic module 450 operates on energy consumption data with user profile information from user profile module 430 and statistical information from statistical module 440 and/or other information to provide energy consumption analysis functionality. Analytic module 450 may provide various forms of analysis that may be used, for example, to provide feedback to a user (e.g., in the form of a graphical representation of energy usage), to a building administrator, to a building management system, etc. Analytic module 450 may also provide or maintain historical analytical data that may be used for analysis or for historical records. Analytic module 450 may also provide trending and projection information for energy consumption.

User feedback module 460 provides graphical representations of at least analytical information provided by analytic module 450. User feedback module 460 may cause to be displayed a visual metaphor of energy consumption, for example. Use of a visual metaphor may allow the user to understand his/her energy consumption at a glance without the need to analyze numerical information. User feedback module 460 may also provide comparison information in the graphical feedback. For example, the user may be able to see historical data, trending data, comparisons with other people or groups, building data, floor data, group data, etc.

FIG. 5 is a block diagram of one embodiment of an electronic system. The electronic system illustrated in FIG. 5 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

Electronic system 500 includes bus 505 or other communication device to communicate information, and processor 510 coupled to bus 505 that may process information. While electronic system 500 is illustrated with a single processor, electronic system 500 may include multiple processors and/or co-processors. Electronic system 500 further may include random access memory (RAM) or other dynamic storage device 520 (referred to as main memory), coupled to bus 505 and may store information and instructions that may be executed by processor 510. Main memory 520 may also be used to store temporary variables or other intermediate information during execution of instructions by processor 510.

Electronic system 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled to electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device may include alphanumeric input 560 may be, for example, a mouse, a trackball, or cursor direction keys to communicate direction information and command selections to processor 510 and to control cursor movement on display 550. In one embodiment, electronic system 500 includes energy agent 570, which may be an energy agent as described herein.

Electronic system 500 further may include network interface(s) 580 to provide access to a network, such as a local area network. Network interface(s) 580 may include, for example, a wireless network interface having antenna 585, which may represent one or more antenna(e). Network interface(s) 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface(s) 580 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In one embodiment, the energy consumption information is gathered without the support of a dedicated hardware power meter or sensor. That is, the platform may be self-monitoring and determine its own energy consumption information from monitoring operational states.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
monitoring energy consumption of one or more energy consuming devices corresponding to a range of concurrent activities for a user, wherein the energy consumption is determined from a plurality of sensors including at least one power meter and at least one soft sensor that provides data in sensor format derived from other forms of data;
determining a location of one or more of the energy consuming devices with a location agent;
utilizing user profile information, the location and user statistical information to analyze the monitored energy consumption to generate a personal energy usage profile for the user;
transmitting the personal energy usage profile to a computing platform associated with the user, wherein the personal energy usage profile includes total energy usage as well as energy usage for one or more of the energy consuming devices and the personal energy usage profile also provides comparisons to other users, groups of users and targets.

2. The method of claim 1 wherein the user profile information comprises one or more of an organization for the user, credential information for the user, logistic information for the user.

3. The method of claim 1 wherein the user profile information comprises one or more of user controllable components, ambient data and feedback provided by the user.

4. The method of claim 1 wherein the user statistical information comprises user proximity information with respect to the computing platform.

5. The method of claim 1 wherein the user statistical information comprises user input frequency information.

6. The method of claim 1 wherein the energy usage profile indicates an overall energy usage for the user and a component energy usage for the user.

7. The method of claim 1 wherein the usage profile is utilized to generate an alert in response to energy usage exceeding a predetermined level.

8. The method of claim 1 wherein the usage profile indicates a user energy usage as compared to a group energy usage.

9. A non-transitory computer-readable medium having stored thereon sequences of instructions that, when executed, cause one or more processors to:
monitor energy consumption of one or more energy consuming devices corresponding to a range of concurrent activities for a user, wherein the energy consumption is determined from a plurality of sensors including at least one power meter and at least one soft sensor that provides data in sensor format derived from other forms of data;
determine a location of one or more of the energy consuming devices with a location agent;
utilize user profile information, the location and user statistical information to analyze the monitored energy consumption to generate a personal energy usage profile for the user;
transmit the personal energy usage profile to a computing platform associated with the user, wherein the personal energy usage profile includes total energy usage as well as energy usage for one or more of the energy consuming devices and the personal energy usage profile also provides comparisons to other users, groups of users and targets.

10. The computer-readable medium of claim 9 wherein the user profile information comprises one or more of an organization for the user, credential information for the user, logistic information for the user.

11. The computer-readable medium of claim 9 wherein the user profile information comprises one or more of user controllable components, ambient data and feedback provided by the user.

12. The computer-readable medium of claim 9 wherein the user statistical information comprises user proximity information with respect to the computing platform.

13. The computer-readable medium of claim 9 wherein the user statistical information comprises user input frequency information.

14. The computer-readable medium of claim 9 wherein the energy usage profile indicates an overall energy usage for the user and a component energy usage for the user.

15. The computer-readable medium of claim 9 wherein the usage profile is utilized to generate an alert in response to energy usage exceeding a predetermined level.

16. The computer-readable medium of claim 9 wherein the usage profile indicates a user energy usage as compared to a group energy usage.

\* \* \* \* \*